United States Patent
Stadniychuk et al.

(10) Patent No.: US 8,313,659 B2
(45) Date of Patent: Nov. 20, 2012

(54) FABRICATION OF MULTI-DIMENSIONAL MICROSTRUCTURES

(75) Inventors: Helena Pavlovna Stadniychuk, Eagan, MN (US); Andrew David Habermas, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 616 days.

(21) Appl. No.: 12/501,372

(22) Filed: Jul. 10, 2009

(65) Prior Publication Data

US 2011/0008581 A1   Jan. 13, 2011

(51) Int. Cl.
  H01B 13/00 (2006.01)
  B32B 3/00 (2006.01)
  C25D 5/02 (2006.01)
  C25D 7/00 (2006.01)
(52) U.S. Cl. .......... 216/13; 428/172; 205/118; 205/122
(58) Field of Classification Search ............... 438/677, 438/633; 205/118, 122; 216/13; 428/172
See application file for complete search history.

(56) References Cited

U.S. PATENT DOCUMENTS

| | | | |
|---|---|---|---|
| 6,466,112 B1 | 10/2002 | Kwon et al. | |
| 6,473,274 B1 | 10/2002 | Maimone et al. | |
| 7,012,489 B2 | 3/2006 | Sherrer et al. | |
| 7,148,772 B2 | 12/2006 | Sherrer et al. | |
| 7,405,638 B2 | 7/2008 | Sherrer et al. | |
| 2003/0222738 A1 | 12/2003 | Brown et al. | |
| 2008/0142974 A1* | 6/2008 | Arakawa | 257/754 |

* cited by examiner

Primary Examiner — Nadine G Norton
Assistant Examiner — Mahmoud Dahimene
(74) Attorney, Agent, or Firm — Hall Estill Attorneys at Law

(57) ABSTRACT

A method for forming a multi-dimensional microstructure, such as but not limited to a three dimensional (3-D) microstructure coil for use in a data transducer of a data storage device. In accordance with some embodiments, the method generally includes providing a base region comprising a first conductive pathway embedded in a first dielectric material; etching a plurality of via regions in the first dielectric material that are each partially filled with a first seed layer that contacts the embedded first conductive pathway; and using the first seed layer to form a conductive pillar in each of the plurality of via regions, wherein each conductive pillar comprises a substantially vertical sidewall that extends to a first distance above the base region.

20 Claims, 5 Drawing Sheets

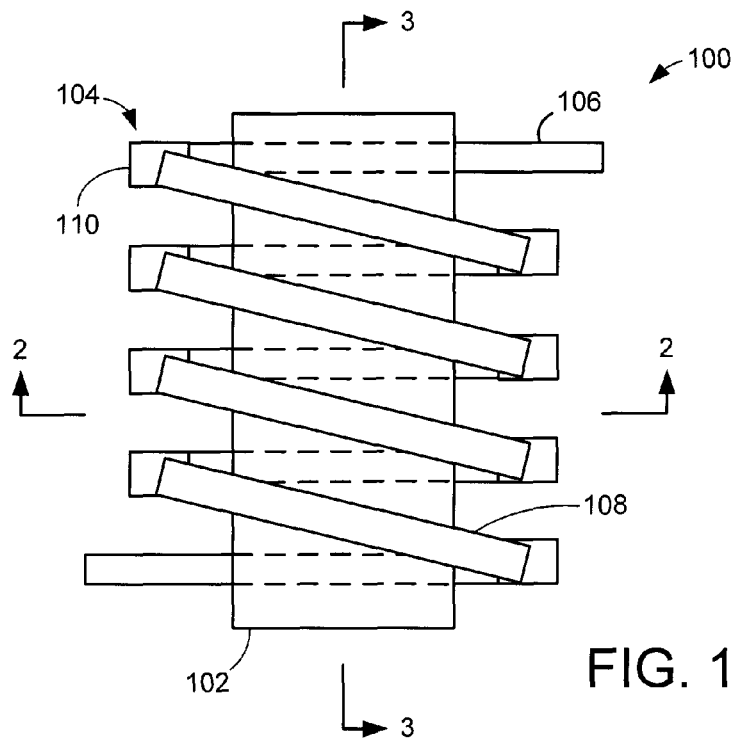
FIG. 1
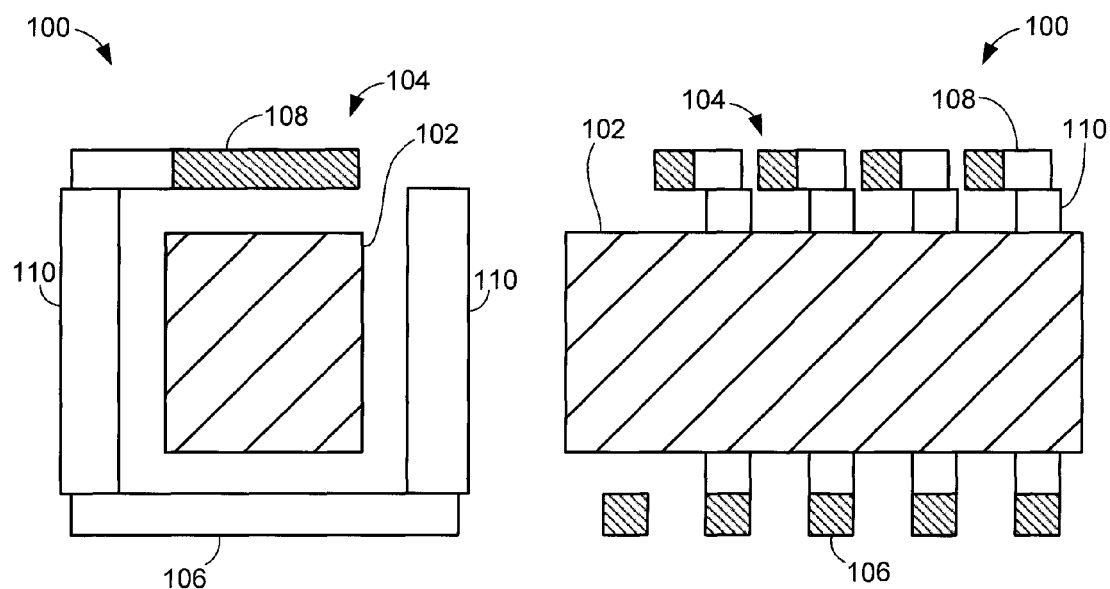
FIG. 2
FIG. 3

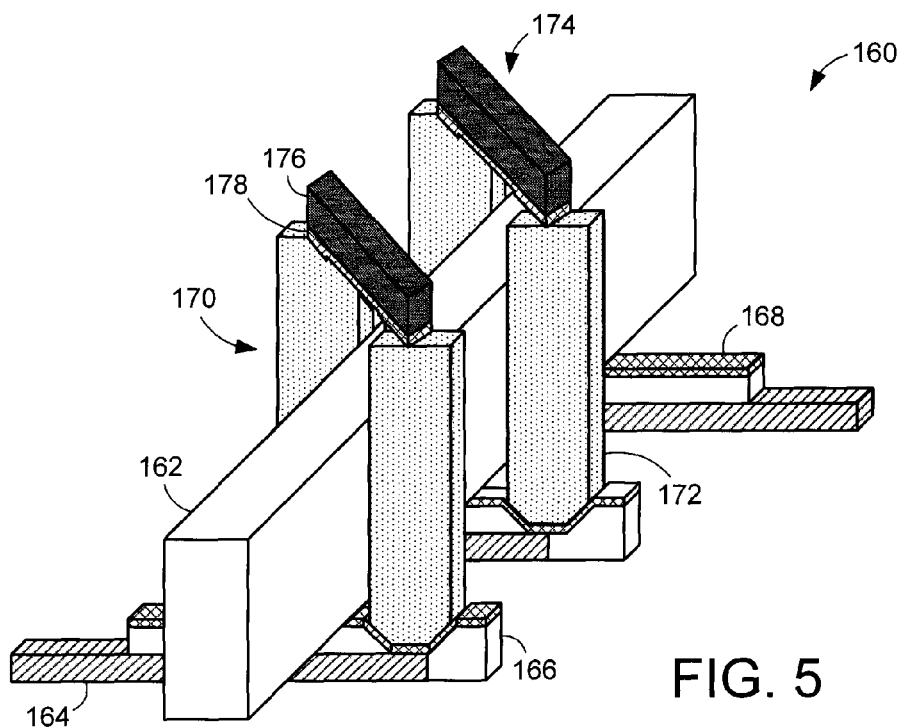
FIG. 5
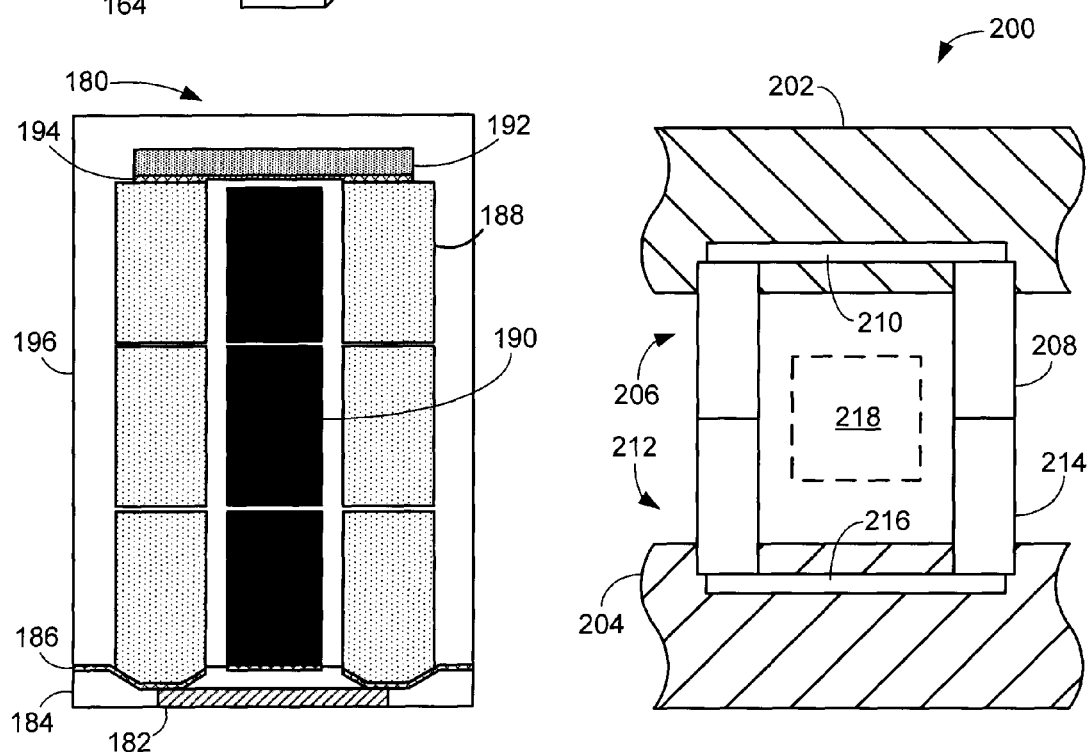
FIG. 6
FIG. 7

FABRICATION OF MULTI-DIMENSIONAL MICROSTRUCTURES

BACKGROUND

Microstructures are a class of miniature devices that conduct a variety of operations depending on the device construction and the environment in which such devices operate. Some microstructures can be characterized as microelectromechanical systems (MEMS) that utilize an electrical signal to operate, such as in the case of a motor or a coil.

As will be appreciated, fabrication of microstructures can be challenging due in part to increased miniaturization of certain macro devices and MEMS elements. Such fabrication may require components having differing dimensions and small tolerances. As such, a high number of complicated processing steps are often needed to provide a suitable microstructure.

In these and other types of microstructures, it is often desirable to increase efficiency of fabrication, particularly with regard to reducing the number and complexity of manufacturing processes.

SUMMARY

Various embodiments of the present invention are generally directed to a method for forming a multi-dimensional microstructure, such as but not limited to a three dimensional (3-D) microstructure coil for use in a data transducer of a data storage device.

In accordance with some embodiments, the method generally comprises providing a base region comprising a first conductive pathway embedded in a first dielectric material; etching a plurality of via regions in the first dielectric material that are each partially filled with a first seed layer that contacts the embedded first conductive pathway; and using the first seed layer to form a conductive pillar in each of the plurality of via regions, wherein each conductive pillar comprises a substantially vertical sidewall that extends to a first distance above the base region.

In accordance with further embodiments, the method generally comprises embedding a first conductive pathway in a first dielectric material; etching a plurality of via regions in the first dielectric material to selectively expose the first conductive pathway; partially filling said via regions with a first seed layer; and using the first seed layer to form a conductive pillar in each of the plurality of via regions in electrical contact with the first conductive pathway.

In yet another embodiment, a three dimensional microstructure apparatus has a common seed layer and at least one first and second vertical components each formed on the common seed layer. The second vertical component is constructed of a different material than the first vertical component while both vertical components have a uniform cross-section that consists of a straight vertical sidewall profile.

These and other features and advantages which characterize the various embodiments of the present invention can be understood in view of the following detailed discussion and the accompanying drawings.

BRIEF DESCRIPTION OF THE DRAWINGS

FIG. 1 is a general representation of an exemplary microstructure constructed and operated in accordance with various embodiments of the present invention.

FIG. 2 displays a cross-section view of the exemplary microstructure of FIG. 1.

FIG. 3 shows a cross-section view of the exemplary microstructure of FIG. 1.

FIG. 5 provides an isometric view of an exemplary microstructure constructed and operated in accordance with various embodiments of the present invention.

FIG. 6 illustrates an exemplary microstructure constructed and operated in accordance with various embodiments of the present invention.

FIG. 7 shows yet another exemplary microstructure used as an electrical and mechanical interconnection between respective semiconductor layers in an electronic device.

DETAILED DESCRIPTION

Figure 4A:
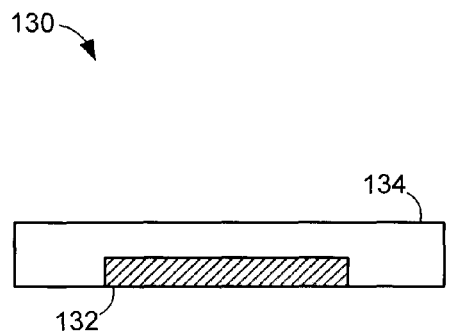
FIG. 4A-4H generally illustrates a manner in which a microstructure can be fabricated in accordance with various embodiments of the present invention.

The present disclosure generally relates to the fabrication of multi-dimensional microstructures, and in particular to methods and devices that may be used to improve the efficiency of manufacturing such microstructures. Prior art microstructures are often formed using technically challenging operations that require numerous intricate steps. For example, multiple different materials can often not be constructed within sufficient tolerances. Moreover, some existing fabrication methodologies cannot readily incorporate dissimilar conductive materials into the same microstructure.

Accordingly, a microstructure fabrication methodology is disclosed herein which provides a microstructure with an embedded first conductive pathway that connects a plurality of conductive pillars with substantially vertical sidewalls. This allows the use of simple manufacturing processes and the incorporation of numerous dissimilar materials. As such, operational characteristics of the microstructures can be adjusted and improved through the modification of dimensional and structural relationships between the components of the microstructure.

FIG. 1 provides a top plan representation of an exemplary microstructure 100 constructed and operated in accordance with various embodiments of the present invention. The microstructure 100 is generally characterized as an inductor with a conductive coil that encircles a conductive, magnetically permeable element, such as a ferromagnetic core. It will be appreciated that such characterization of the microstructure 100 is merely for purposes of illustrating a particular embodiment and is not limiting to the claimed subject matter.

The core of the microstructure 100 is denoted at 102 in FIG. 1. The encircling conductive coil is generally denoted at 104 and includes a plurality of first conductive pathways 106 and second conductive pathways 108 which electrically connect vertically extending conductive pathways 110. The first pathways (conductors) 104 are embedded in an underlying dielectric substrate (not separately shown in FIG. 1) and the second conductors 106 are supported above the core 102 by the vertical pathways (standoffs) 110 and an intervening dielectric material (not separately shown).

FIG. 2 provides a cross-sectional representation of the microstructure 100 of FIG. 1 along line 2-2 in FIG. 1. Only a single one of the conductors 106 is shown in FIG. 2 for clarity, and this conductor 106 is shown in partial cross section due to the intersection of this conductor with the line 2-2 in FIG. 1. FIG. 3 shows the microstructure 100 along line 3-3 in FIG. 1.

The core 102 is mechanically supported and electrically isolated from the first and second conductors 106, 108 and the standoffs 110. The vertical standoffs 110 are characterized as conductive pillars that extend from the first conductors 106 to an elevation above the height of the core 102. In some embodiments, the pillars 110 are one piece components that are each contactingly coupled to both the first and second conductive pathways 106 and 108. However, the respective orientations of the various conductive pathways can be modified to adjust the operational characteristics of the microstructure 100.

It should be noted that the pillars 110 can also be generated as a vertical three dimensional component of a microstructure. Such vertical components can have a uniform cross-section that consists of a straight vertical sidewall profile. That is, the sidewall is continuously straight and vertical, in contrast to a conical shaped profile that has a non-uniform cross-section that results from existing fabrication methods.

Advantages of the microstructure 100 over other miniature devices include the fact that relatively tight tolerances can achieved through diverse positioning of the various conductive pathways in relation to the conductive element 102. Also, a number of dissimilar materials can be implemented into the various conductive pathways and element to maximize the operational characteristics of the microstructure 100. Such advantageous results can be used for a variety of miniature devices such as, but not limited to, inductive sensors, micro-speakers, micro-actuators, RF communication devices, vibration energy harvesting, and power generation.

An additional advantage of the microstructure 100 is a vertical profile. Such vertical profile can allow for a wider via cross-section at near the first conductive pathway 106 and a lower current requirement for induction of a flux. Likewise, the vertical profile can allow for vertical vias and magnet bars that improve the scalability of the microstructure 100.

FIG. 4A through FIG. 4H provide an exemplary fabrication sequence for a microstructure 130 generally similar to the microstructure 100 of FIGS. 1-3. FIG. 4A illustrates a first conductive pathway 132 embedded in a first dielectric material 134, characterized as a base region. The conductive pathway 132 is formed by depositing a copper seed and subsequently electroplating the seed in a predetermined photoresist pattern. Upon completion of the first conductive pathway, the dielectric material 134 is deposited to embed the first conductive pathway 132. The dielectric material 134 is not limited to a single element or compound and can be a variety of non-conductive materials such as oxides. While only a single embedded pathway 132 is shown in FIG. 4, additional pathways can be concurrently formed in adjacent, spaced apart relation as in FIGS. 1-3.

Figure 4B:
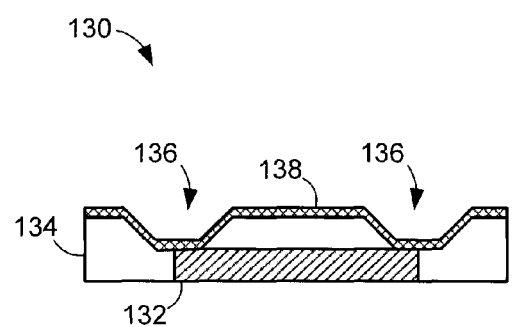

FIG. 4B generally illustrates the formation of a plurality of via regions 136 in the dielectric material 134 in accordance with various embodiments of the present invention. The via regions 136 can be formed so that one or more localized regions of the first conductive pathway 132 are exposed to be capable of electrical connections. While the via regions 136 are shown with tapered sidewalls, such configuration is not required or limited. For example, the via regions 136 can be asymmetric and have a variety of sidewall designs.

Figure 4C:
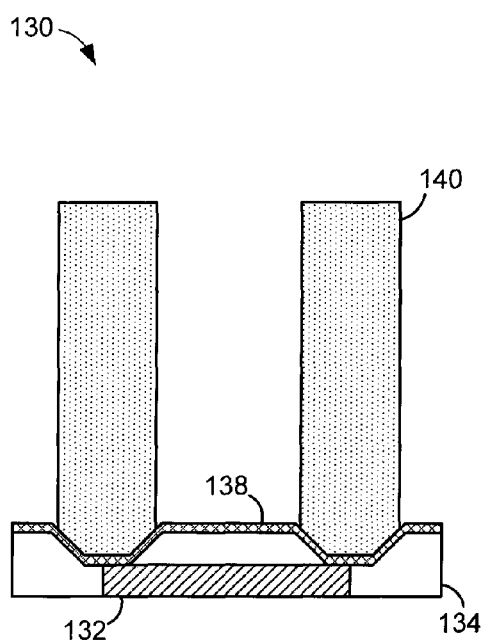

A first seed layer 138 is applied adjacent the first dielectric material 134 and the exposed portions of the first conductive pathway 132. The first seed layer 138 is patterned with a photoresist and a conductive pillar 140 is formed in each via region 136, as shown in FIG. 4C. The conductive pillars 140 are shown to uniformly extend to a common first elevational distance above the base region, but it will be appreciated that different pillars can have different elevational heights and different cross-sectional dimensions, as desired.

The conductive pillars 140 are each electrically connected to opposing ends of the first conductive pathway 132 through the via regions 136 and the first seed layer 138. The conductive pillars 140 can be created with a variety of different processes. In some embodiments, the conductive pillars 140 are formed as a single piece using a single electroplating operation. In other embodiments, the conductive pillars 140 are formed from of incremental layers of deposited material that gradually build the pillars to the desired height.

Figure 4D:
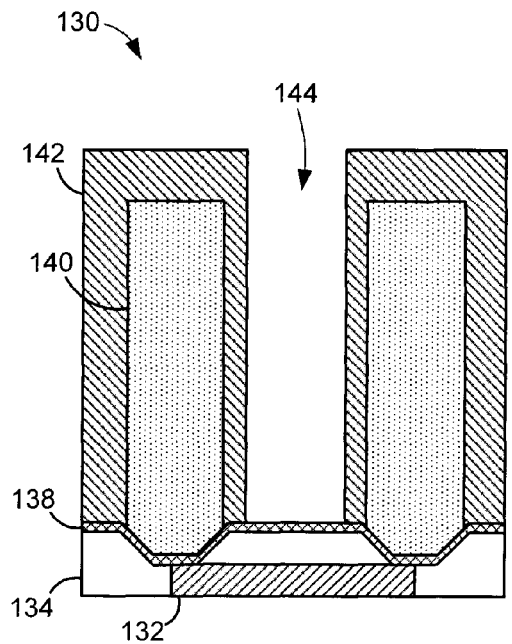
Figure 4E:
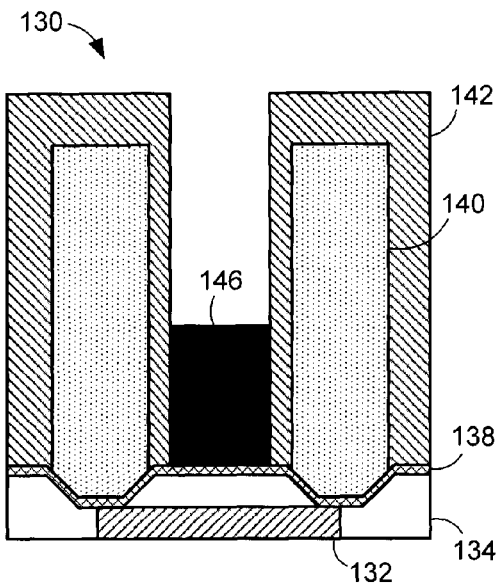
Figure 4F:
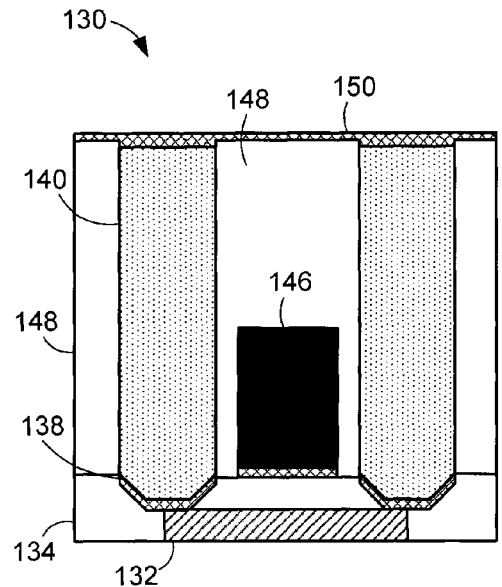

FIG. 4D shows application of a patterning material 142 to the microstructure 130. The patterning material 142 embeds each conductive pillar 140 while defining a central region 144 with substantially vertical sidewalls. In some embodiments, the patterning material 142 can be deposited with a photoresist operation that creates a planar surface around the conductive pillars 140 and allowing to precisely pattern the central region 144. As desired, a conductive element 146 (e.g., core) is formed within the central region 144 by depositing conductive material therein as shown in FIG. 4E. The conductive element 146 extends to a second distance above the base region that is below the first distance and the overall height of the conductive pillars 140. The shape and dimensions of the conductive element 146 can vary, and the first conductive pathway 132 and conductive pillars 140 can be made to partially surround the conductive element 146 on multiple sides.

It will be noted from FIG. 4E that the seed layer 138 forms a continuous pathway that electrically interconnects the conductive element 146 with the pillars 140. As desired, a material removal process such as ion milling is carried out to remove some or all of the seed layer 138 between the conductive element 146 and the pillars 140, resulting in the configuration of FIG. 4F. A second dielectric material 148 can be backfilled into the central region 144 during this processing to replace the removed patterning material 142 and electrically isolate the conductive element 146 from the pillars 140. The second dielectric material 148 covers the vertical sidewalls of the pillars 140, but leaves the tops thereof exposed for further processing.

A second seed layer 150 is next deposited onto the second dielectric material 148 and the exposed portions of the conductive pillars 140. The second dielectric material 148 can be polished with a chemical mechanical polishing process prior to the second seed layer being formed. Copper or some other suitable material can be used for the second seed layer 150.

Figure 4G:
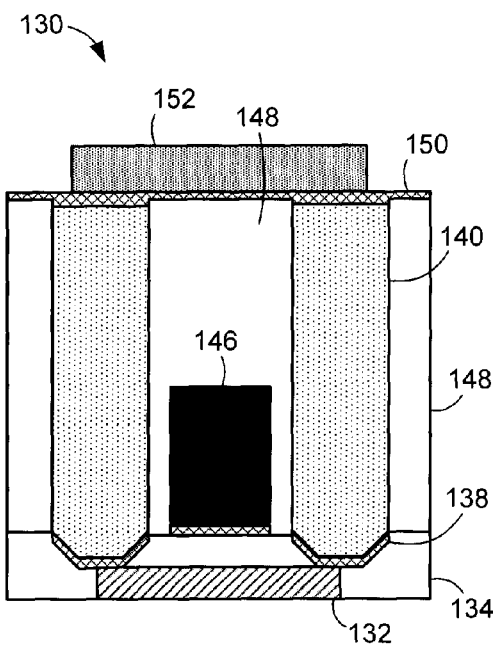

In FIG. 4G, the electrical connection between the conductive pillars 140 is further enhanced with the creation of a second conductive pathway 152 that is contactingly adjacent the second seed layer 150. As with the first conductive pathway 132, the second conductive pathway 152 can be formed with a variety of processes including, but not limited to electroplating. The formation of the second conductive pathway 152 can be facilitated in multiple layering processes or with a single on-piece simultaneous growth process. As a result of the second conductive pathway 152, the conductive element 146 is encircled with a conductive ring of components that are capable of translating electrical signals completely around the conductive element 146 without interruption. Multiple second conductive pathways 152 can be formed during this step, and can be arranged to extend at a non-orthogonal angle to terminate at different ones of the pillars 140, as in FIGS. 1-3.

Figure 4H:
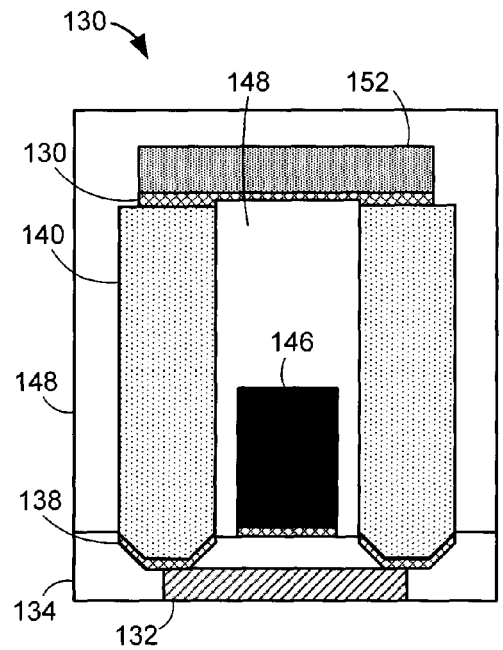

FIG. 4H generally illustrates the finalization of the microstructure 130 with the removal of the second seed layer 150 from portions of the second dielectric material 148, as well as removal of the second seed layer from localized areas of each conductive pillar 140. Additional amounts of the second dielectric material 148 can be deposited to encapsulate the microstructure 130, as desired.

The microstructure 130 in FIGS. 4A-4H is formed to have a two dimensional aspect, that is, along a single intersecting plane. As noted above, the process can be readily adapted to form a microstructure with a three dimensional (3-D) aspect, that is, one that lies along multiple intersecting planes, as generally illustrated in FIG. 5.

FIG. 5 shows an exemplary microstructure 160 constructed and operated in accordance with various embodiments of the present invention. A three dimensional implementation of the microstructure shown in FIGS. 4A-4H can result in a variety of different designs, to which no single configuration is limiting. However, the presence of a first conductive pathway 162 connected to at least one vertical conductive pathway 164 that is coupled to a second conductive pathway 166 so that electrical signals can repetitively encircle the conductive element 168.

As can be appreciated, the conductive pathways of the microstructure 160 can form a continuously conductive coil about the conductive element 168. However, such configuration as a coil does not necessarily eliminate the various structural components of the microstructure, such as the first dielectric material 170, first seed layer 172, and second seed layer 174. Furthermore, even though a second dielectric material is not shown in FIG. 5, the microstructure 160 can be supplied with a protective dielectric material that embeds the conductive element 168, conductive pillars 174, and second conductive pathway 166 so that no conductive surface is exposed.

It should be noted that the microstructure 160 is merely a general representation of a three dimensional microstructure fabricated with the steps shown in FIGS. 4A-4H. As such, the three dimensional microstructure 160 can be modified, as desired, to adjust the structural and operational characteristics of the device. For example, the dimensions and position of the conductive pillars 174 can be modified to conduct a higher amount of electrical current in closer proximity to the conductive element 168. In yet another example, a higher number of conductive pathways can be utilized to create a coil with more turns about the conductive element 168.

FIG. 6 displays one such alternative exemplary microstructure 180 that is constructed and operated in accordance with various embodiments of the present invention. The microstructure 180 has a first conductive pathway 182 partially embedded by a first dielectric material 184 and electrically coupled to a first seed layer 186 in a similar fashion as displayed in FIGS. 4A-4H. However, the microstructure 180 has a plurality of conductive pillars 188 vertically stacked and aligned to be capable of carrying electrical signals without interruption. Similarly, numerous conductive elements 190 are vertically stacked and aligned.

While individual components are shown forming the conductive pillars 188 and conductive element 190, such formation is not limiting as the fabrication process displayed in FIGS. 4C-4E can be repeated to generate a single conductive pillar 188 and conductive element 190. In some embodiments, several dissimilar materials are used in constructing the conductive pillars 188 and/or the conductive element 190, but the use of dissimilar materials is not required.

FIG. 7 shows a portion of an electronic device 200 that uses microstructures as disclosed herein to provide mechanical support and electrical interconnection of different semiconductor layers 202, 204. More specifically, a first microstructure 206 is formed in the first layer having one or more pillars 208 and embedded conductive pathways 210, and a second microstructure 212 is formed in the second layer 204 with one or more pillars 214 and embedded conductive pathways 216. The respective pillars 208, 214 are mated together as shown to secure and interconnect the second layer 204 relative to the first layer. Other configurations are readily envisioned, including configurations where a pillar from one layer nests or otherwise engages a feature formed on the other layer.

As desired, an intermediate element (shown in dashed lines at 218) can be placed within the respective microstructures 202, 204. The element can take the form of a conductive core as discussed above, or some other suitable configuration. For example, the element 218 can be used for electrical noise suppression and can be manifested as electrical components in a circuit between the respective layers.

Figure 8:
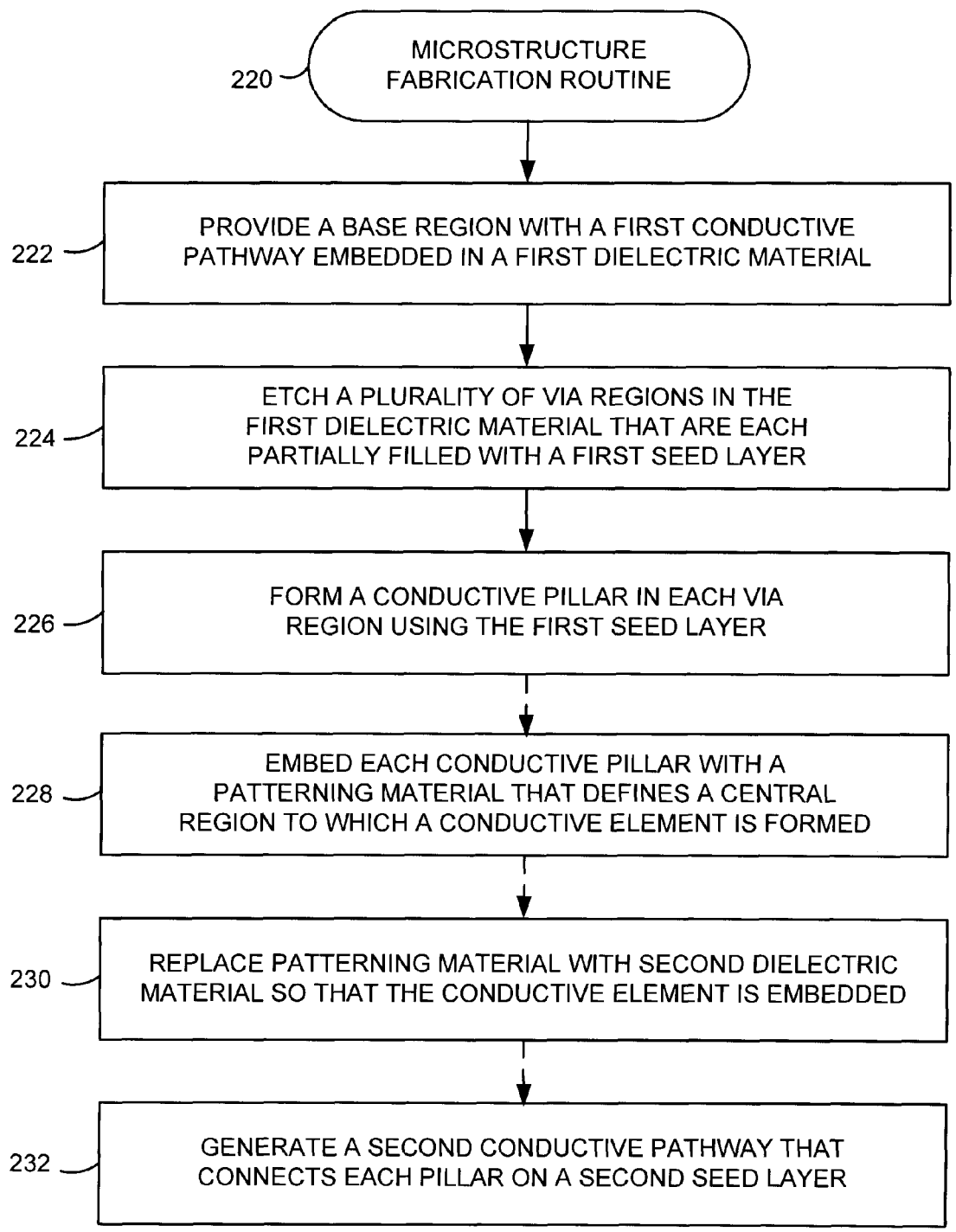
FIG. 8 provides a flowchart of an exemplary MICROSTRUCTURE FABRICATION PROCESS carried out in accordance with various embodiments of the present invention.

FIG. 8 provides a flowchart of an exemplary microstructure fabrication routine 220 carried out in accordance with various embodiments of the present invention. It will be appreciated that various steps can be omitted and other, additional steps can be included depending on the requirements of a given application.

Initially, a base region with a first conductive pathway embedded in a first dielectric material is provided at step 222. A plurality of via regions are formed in the first dielectric material at step 224, so that a localized portion of the first conductive pathway is exposed. The via regions are covered and partially filled with a first seed layer that covers the exposed portions of the first conductive pathway during this step.

In step 226, a conductive pillar is formed in each via region using the first seed layer. In some embodiments, each conductive pillar extends to a first distance above the base region and consists of substantially vertical sidewalls. With the conductive pillars fully formed, step 228 embeds each conductive pillar with a patterning material that defines a central region that is used to form a conductive element. Step 228 is capable of being performed once to simultaneously embed the conductive pillars and define the central region so that no intermediate step is required before forming the conductive element, but such timing is not limited or required.

Step 230 replaces the patterning material with a second dielectric material that embeds the conductive element while substantially covering the sidewalls of the conductive pillars up to the first distance. Various embodiments further deposit a second seed layer onto the exposed topmost portions of the conductive pillars. A second conductive pathway is then generated in step 232 on the second seed layer to electrically connect the conductive pillars as well as form an uninterrupted coil of conductive pathways about the conductive element.

Alternatively, step 232 can also include depositing the second dielectric material around the second conductive pathway to cover all electrically conductive components and ensure no exposed conductive portions. As shown in FIG. 6, the fabrication routine 200 can be repeated, either in its entirety or in part, to generate a variety of microstructure configurations. Specifically, a three dimensional microstructure can be fabricated with a continuously conductive coil that surrounds a solid conductive element with a plurality of turns and operates as an inductor. In addition, the various steps of the fabrication routine 200 are not limited and can be omitted or performed in different order, as desired to create various microstructures with diverse structural and operational characteristics.

As can be appreciated by one skilled in the art, the various embodiments illustrated herein provide advantages in both microstructure fabrication efficiency and complexity due to the elimination of technically challenging construction operations. The replacement simple fabrication processes allow for more precise microstructure components with less intricate formation preparation. Moreover, manufacturing accuracy can be greatly improved by reducing the complexity associated with the various manufacturing methods, such as vertical conductive pillar formation. However, it will be appreciated that the various embodiments discussed herein have numerous potential applications and are not limited to a certain field of electronic media or type of data storage devices.

Furthermore, a skilled artisan can appreciate that the various embodiments illustrated herein allow advantageous construction of microstructures by not requiring the filling of etched vias that involves more processing steps and a higher manufacturing cost. In fact, the filling of etched vias often prove more challenging when deep vias (i.e. tall aspect ratio) are filled because the etched vias will likely have a tapered slope resulting in smaller bottom contact area and problematic scalability. Additionally, a greater amount of defects can be found with etched and filled vias due to higher difficulty in cleaning inside the awkward shaped vias prior to filling.

While the various embodiments disclosed herein place the various conductive pillars in contacting engagement with the opposing ends of the embedded first conductive pathways, it will be appreciated that such is not limiting. The conductive pillars can be located as desired with relation to the embedded first conductive pathways, including in contacting engagement with a medial portion thereof. For purposes of the appended claims, the term "dissimilar materials" and the like will be construed consistent with the foregoing discussion to describe different types of conductive materials that do not share a common element, such as a copper alloy that does not include iron, and an iron alloy that does not include copper.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method for forming a multi-dimensional microstructure, comprising:
   providing a base region comprising a first conductive pathway embedded in a first dielectric material;
   etching a plurality of via regions in the first dielectric material that are each partially filled with a first seed layer that contacts the first conductive pathway;
   using the first seed layer to form an electrically conductive vertical structure in each of the plurality of via regions, wherein each electrically conductive vertical structure comprises a substantially vertical sidewall that extends to a first distance above the base region; and
   depositing a second dielectric layer to contact less than all of an areal extent of the electrically conductive vertical structure.

2. The method of claim 1, wherein the first dielectric material is an oxide.

3. The method of claim 1, wherein the electrically conductive vertical structures are formed with an electroplating operation.

4. The method of claim 1, wherein the using step further comprises:
   embedding each electrically conductive vertical structure with a patterning material that defines a central region to which a conductive element is formed that extends a second distance above the base region;
   generating a second conductive pathway that electrically connects each pillar on a second seed layer that is contactingly adjacent to the second dielectric material at the first distance.

5. The method of claim 1, wherein the first conductive pathway comprises opposing first and second ends, wherein a first electrically conductive vertical structure is formed in contact with the first end, and wherein a second electrically conductive vertical structure is formed in contact with the second end.

6. The method of claim 1, further comprising forming a conductive element above the first electrically conductive pathway and between an adjacent pair of electrically conductive vertical structures, the conductive element mechanically supported and electrically isolated from the first conductive pathway and the adjacent pair of electrically conductive vertical structures by an intervening dielectric material.

7. The method of claim 1, wherein the microstructure is characterized as an inductor.

8. A method for forming a multi-dimensional microstructure, comprising:
   embedding a first conductive pathway in a first dielectric material;
   etching a plurality of via regions in the first dielectric material to selectively expose the first conductive pathway;
   partially filling the via regions with a seed layer; and
   using the seed layer to form a conductive pillar in each of the plurality of via regions in electrical contact with the first conductive pathway; and
   depositing a second dielectric layer to contact less than all of an areal extent of each conductive pillar.

9. The method of claim 8, wherein each conductive pillar comprises a substantially vertical sidewall that extends to a first distance above the base region.

10. The method of claim 8, further comprising forming an electrically conductive element between an adjacent pair of conductive pillars and above the first conductive pathway, the conductive element electrically isolated from each of the adjacent pair of conductive pillars.

11. The method of claim 10, wherein the conductive pillars and conductive element are formed from dissimilar materials.

12. The method of claim 10, wherein the conductive element is a ferromagnet.

13. The method of claim 8, wherein a conductive coil is formed that encircles a conductive element from the first conductive pathway and the conductive pillars.

14. The method of claim 8, wherein the using step further comprises:
   embedding each pillar with a patterning material that defines a central region;
   forming a conductive element within the central region;
   removing the patterning material and portions of the first seed layer between the conductive element and the respective conductive pillars.

15. The method of claim 14, further comprising:
   forming a second conductive pathway that electrically connects an adjacent pair of the conductive pillars, the second conductive pathway spanning the conductive element.

16. The method of claim 15, wherein the first conductive pathway linearly extends in a first direction, and wherein the second conductive pathway linearly extends in a second direction non-orthogonal to the first direction.

17. The method of claim 8, wherein the first conductive pathway comprises opposing first and second ends, wherein a first conductive pillar is formed in contacting engagement with the first end, and wherein a second conductive pillar is formed in contacting engagement with the second end.

18. The method of claim 8, wherein the conductive pillars are each one piece components that are formed in a single electroplating operation.

19. The method of claim 8, wherein the via regions are the only etched features in the microstructure.

20. A method comprising:
   embedding a conductive pathway in a first dielectric material;
   etching a plurality of via regions in the dielectric material to selectively expose the conductive pathway;
   partially filling the via regions with a seed layer;
   using the seed layer to form a conductive pillar in each of the plurality of via regions in electrical contact with the conductive pathway, at least one conductive pillar comprising a plurality of vertically stacked and aligned sub-pillars capable of carrying an electrical signal without interruption; and
   depositing a second dielectric layer to contact less than all of an areal extent of the at least one conductive pillar.

* * * * *